United States Patent
Robinson et al.

(10) Patent No.: US 11,610,704 B2
(45) Date of Patent: Mar. 21, 2023

(54) CORONA PREVENTION IN HIGH POWER CIRCULATORS

(71) Applicant: Lockheed Martin Corporation, Bethesda, MD (US)

(72) Inventors: Kevin L. Robinson, Clay, NY (US); Kenneth R. Boswell, Simi Valley, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 518 days.

(21) Appl. No.: 16/719,622

(22) Filed: Dec. 18, 2019

(65) Prior Publication Data

US 2020/0203044 A1    Jun. 25, 2020

Related U.S. Application Data

(60) Provisional application No. 62/784,206, filed on Dec. 21, 2018.

(51) Int. Cl.
| | |
|---|---|
| *H01B 17/00* | (2006.01) |
| *H01B 17/42* | (2006.01) |
| *H05K 3/28* | (2006.01) |
| *H01P 1/38* | (2006.01) |
| *H05K 1/02* | (2006.01) |

(52) U.S. Cl.
CPC ............ *H01B 17/42* (2013.01); *H01P 1/38* (2013.01); *H05K 3/28* (2013.01); *H05K 1/0256* (2013.01); *H05K 1/0259* (2013.01)

(58) Field of Classification Search
CPC . H01B 17/42; H01P 1/38; H05K 3/28; H05K 1/0256; H05K 1/0259
See application file for complete search history.

(56) References Cited

U.S. PATENT DOCUMENTS

| | | | |
|---|---|---|---|
| 6,485,659 B1 | 11/2002 | Goedde | |
| 7,863,522 B2 | 1/2011 | Han et al. | |
| 8,716,606 B2 | 5/2014 | Kelley et al. | |
| 9,719,660 B1* | 8/2017 | Petluri | ..................... F21K 9/64 |
| 10,505,246 B2 | 12/2019 | Robison | |
| 2006/0225274 A1* | 10/2006 | Greenberg | ............. H05K 1/032 29/829 |
| 2007/0197051 A1 | 8/2007 | Cravey | |
| 2008/0217793 A1 | 9/2008 | Choudhary et al. | |
| 2009/0273410 A1 | 11/2009 | Arakawa | |
| 2010/0036038 A1 | 2/2010 | Rodgers | |

(Continued)

FOREIGN PATENT DOCUMENTS

| | | |
|---|---|---|
| CN | 204361237 | 5/2015 |
| JP | 04255612 | 9/1992 |

OTHER PUBLICATIONS

JP H04255612 A (Year: 1992).*

(Continued)

*Primary Examiner* — Pete T Lee
(74) *Attorney, Agent, or Firm* — Michael Best & Friedrich LLP

(57) ABSTRACT

A method for preventing corona effects in an electronic circuit comprising applying a coating of a first material to a surface of the electronic circuit, and applying a second material having a dielectric constant that is lower than that of the first material on an exposed surface of the first material, wherein the second material comprises a solid dielectric.

10 Claims, 5 Drawing Sheets

(56) References Cited

U.S. PATENT DOCUMENTS

| | | |
|---|---|---|
| 2010/0181094 A1 | 7/2010 | Duarte Pena |
| 2013/0127365 A1* | 5/2013 | Schubert ................ H05B 45/20 |
| | | 315/250 |
| 2014/0330056 A1 | 11/2014 | Klosin |
| 2015/0206624 A1* | 7/2015 | Choi ........................ H01B 7/04 |
| | | 174/120 C |
| 2016/0028139 A1 | 1/2016 | Cruickshank et al. |
| 2016/0241002 A1* | 8/2016 | Tremaine ................ H02B 1/44 |
| 2016/0325113 A1* | 11/2016 | Khan .................. H01L 51/0061 |

OTHER PUBLICATIONS

International Search Report and Written Opinion of the International Searching Authority issued in PCT/US2017/047559, dated Oct. 25, 2017.

\* cited by examiner

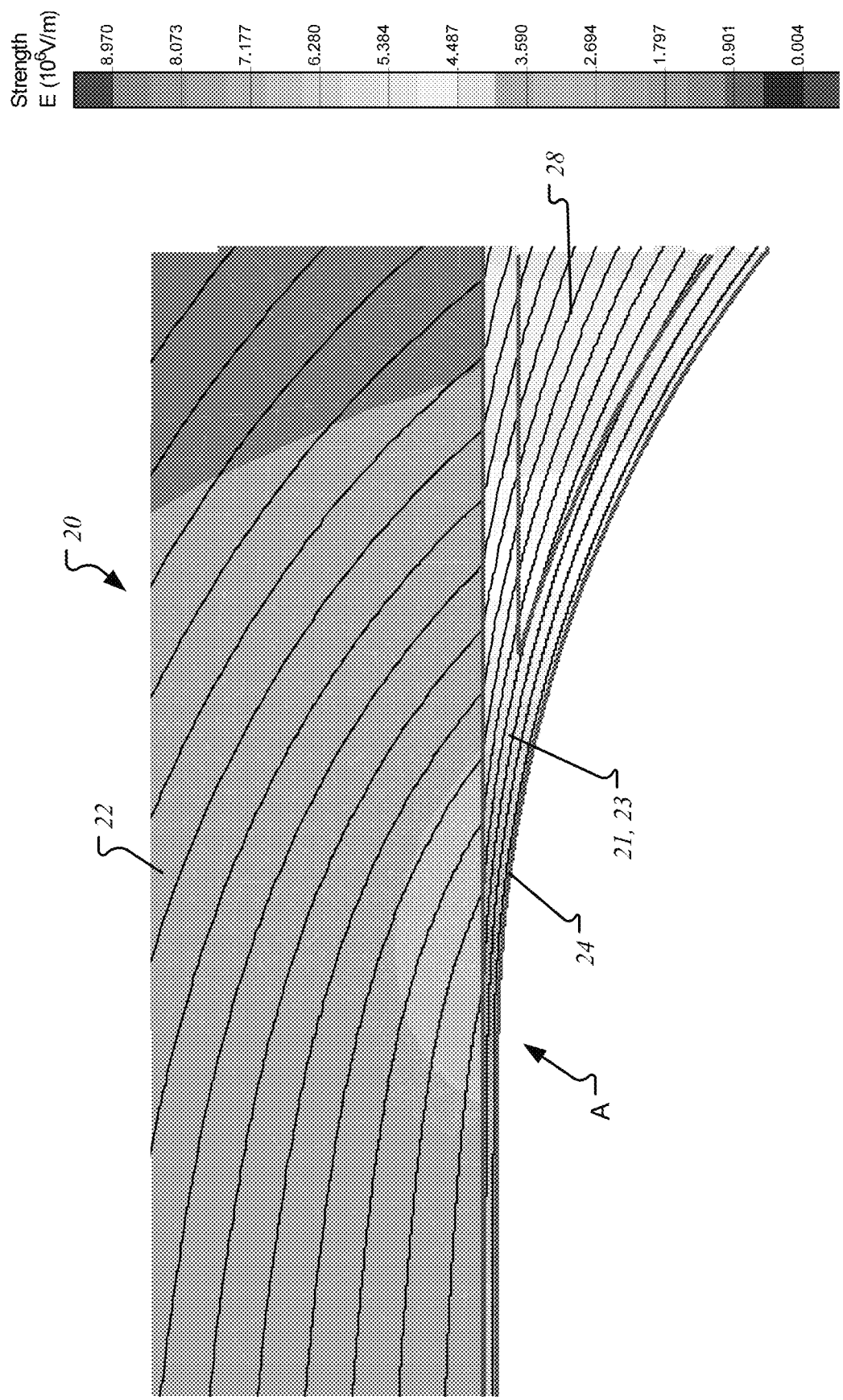

FIG. 5

| | Parylene Thickness (mils) | RTV 615 Electric Field Strength Maximum (MV/m) | RTV 615 Electric Field Strength Maximum (V/mil) | RTV 615 Safety Factor | Parylene Electric Field Strength Maximum (MV/m) | Parylene Electric Field Strength Maximum (V/mil) | Parylene Safety Factor |
|---|---|---|---|---|---|---|---|
| Conventional Potting Schemes | N/A | 10.3 | 261.6 | 1.9 | N/A | N/A | N/A |
| Parylene/Silicone Rubber | .5 + .5 + 2.0 fill | 5.2 | 132.6 | 3.8 | 9.0 | 227.8 | 30.7 |

Breakdown voltage ratings

| | | |
|---|---|---|
| RTV 615 rating | 19.7 | 500 |
| Dry air rating | 3 | 76.2 |
| Parylene rating | 275 | 7000 |

CORONA PREVENTION IN HIGH POWER CIRCULATORS

CROSS REFERENCE TO RELATED APPLICATION(S)

This application is based upon and claims benefit of priority from U.S. Provisional Patent Application 62/784,206, filed on Dec. 21, 2018, the entire contents of which are incorporated herein by reference.

FIELD

Embodiments of the disclosed subject matter related to inhibiting the formation or initiation of corona in high power circulators.

BACKGROUND

The "background" description provided herein is for the purpose of generally presenting the context of the disclosure. Work of the presently named inventor(s), to the extent it is described in this background section, as well as embodiments of the description which may not otherwise qualify as prior art at the time of filing, are neither expressly or impliedly admitted as prior art.

Corona initiation and eventual corona discharge in circuits, for example high power radio frequency (RF) circuits, represents a fundamental power handling limitation. Electric field strengths responsible for corona initiation depend on the material voltage breakdown of the isolating dielectric material(s) used, as well as the circuit geometry and associated dielectric discontinuities. These factors can create electric field strength multipliers which eventually induce corona effects.

Insulating potting compounds have been applied to high voltage circuits or circuit assemblies to improve their ability to withstand higher voltages and thus, higher electric field strengths for reducing detrimental corona effects. Methods for preventing corona initiation in circuits requiring even higher voltage handling capability often include increasing the physical size of circuit components, thus maintaining the electric field strengths despite the presence of higher voltages. However, in some applications, the size of relevant components may be restricted for any number of reasons including space constraints and/or performance considerations. One such example includes RF circulators used in modern radar applications, where the thickness of ferrite materials utilized therein cannot be increased indefinitely. In particular, their size may be constrained by the potential for additional modes of propagation within the circulator, which may be destructive or otherwise detrimental to the performance of the circuit.

FIG. 1 provides a simplified cross-section view of an exemplary circulator assembly 10, including ferrites or garnets 12 and associated circuitry 14. During production, these components may be arranged within a housing or enclosure 16. A potting compound 18 is used to fill in any void space created within enclosure 16 prior to its sealing. This space includes indicated junction areas A, wherein charged circuitry 14 meets a combination of high and low dielectric materials leading to elevated electric field strengths. As the size of garnets 12 and associated circuitry 14 is constrained for the reasons set forth above, the effectiveness of potting compound 18 is the limiting factor for controlling electric field strengths, and thus, for preventing corona initiation and subsequent discharge.

Alternative solutions for preventing corona effects include constructing circuit assemblies with components having dielectric constants that are nearly equal throughout, mitigating or eliminating electric field strength multiplication factors, and more uniformly distributing the formation of any electric fields. However, these solutions are ineffective for high power RF circulators.

Accordingly, alternative systems and methods for prevention of corona initiation, and circuits utilizing the same, are desired.

SUMMARY

In one embodiment of the disclosure a method for preventing corona initiation in an electronic circuit is provided. The method includes the steps of applying a first polymer material, such as a parylene coating having a first dielectric strength, to a surface of the electronic circuit. The electronic circuit is arranged within a housing or enclosure, wherein a second coating of the first polymer material may be applied to exposed surfaces within the enclosure. A second polymer material, such as a silicone rubber solid dielectric having a second dielectric strength that is lower than the dielectric strength of the first material, is used to fill a remainder of the enclosure.

In another embodiment of the disclosure, an electrically insulated electrical circuit assembly is provided. The assembly includes an enclosure having at least one electronic circuit element contained therein. The at least one circuit element comprises a first polymer material (e.g., a parylene coating) applied to an exterior or exposed surface thereof. A remainder of an interior volume of the enclosure contains a second polymer material, such as a silicone rubber.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings.

FIG. 4 is a graphical illustration of resulting electric field strengths of a circulator utilizing a potting scheme according to one or more embodiments of the present disclosure.

FIG. 5 is a table showing characteristics of an embodiment of the present disclosure in relation to conventional potting schemes.

DETAILED DESCRIPTION

Figure 1:
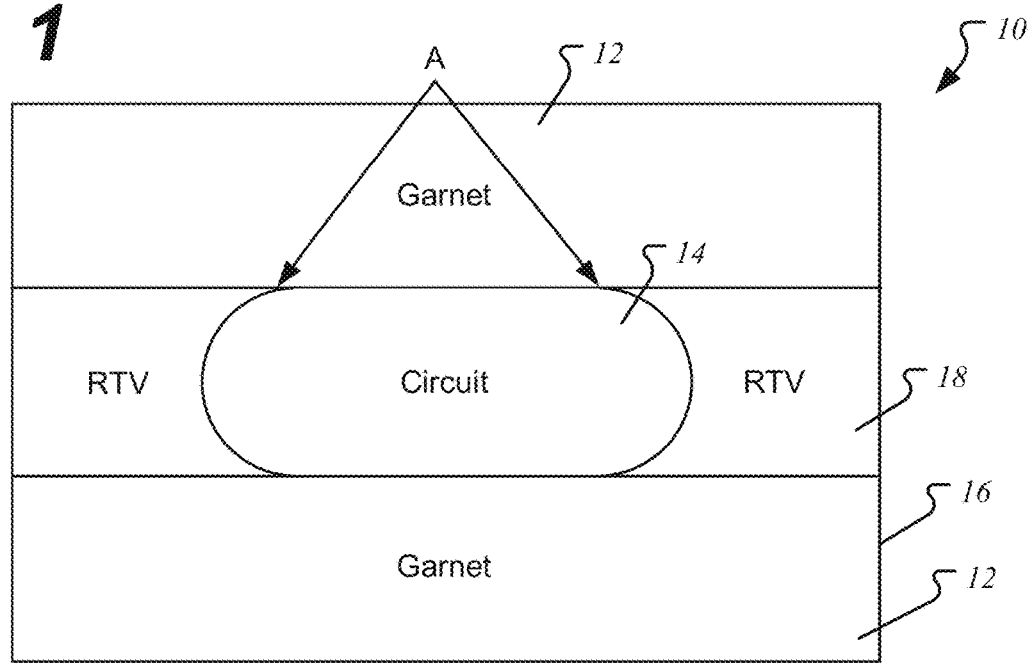
FIG. 1 is a cross-section view of a simplified RF circulator potted with a single silicone material.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "upper," "lower," "front," "rear," "side," "interior," "exterior," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Generally, embodiments of the disclosed subject matter involve the use of a new material in the manufacture of high power circuitry, such as high power circulators. Embodiments of the disclosed subject matter can involve a multi-layer coating of a material having an extremely high dielectric strength. Further, such coating can be implemented according to a multiple-step potting process whereby the extremely high dielectric strength material can be placed in the highest electric field strength regions, followed by placement of an electronic grade potting material for the lower electric field strength areas of the assembly. Such coating can lower the electric field in the vicinity of the electronic grade potting material. Further, such configuration can provide for additional safety factor or relatively higher power operation. In one or more embodiments, and as discussed in more detail below, the multi-layer coating may be a two-pass parylene coating between garnet and RTV 615 and between a center conductor and the RTV 615 of a high power circulator.

Embodiments of the present disclosure can include a method of potting an electrical circuit for reducing electric field strengths. The method can include placing a first material of relatively high dielectric strength in areas of an electrical circuit subject to the highest electric field strength, for example, at junctions wherein a charged circuit meets a combination of high and low dielectric materials. The first material may comprise a polymer coating, such as parylene or poly-para-xylylene. In one embodiment parylene C, comprising a dielectric strength of approximately 7,000 V/mil and a dielectric constant of 2.3, may be used. Preferably, the first material comprises a high dielectric strength, as well as the ability to adhere to circuit features (e.g., garnets, copper circuit tracing and silver plating). An alternative conforming coating may include urethanes, however, this material provides lower dielectric strength and higher dielectric loss. This material may be applied to one or more exterior surfaces of an electrical circuit by a chemical deposition process, by way of example only.

A second material of a lower dielectric strength as compared to the first material, such as a silicone rubber compound, can be applied in lower electric field strength locations, or more generally, applied over the first material. In one embodiment, this may include filling a remaining void space of an enclosure containing a circuit coated with the first material with the second material. The silicone rubber based material can be a one component material or a two component material that is cured to a solid state. In one embodiment, the second material may comprise a two-component rubber based material, such as RTV 615, RTV 655, RTV 656, RTV 6428, RTV 6166, RTV 6196, RTV 60, RTV 88, RTV 560, and RTV 567. An exemplary silicone rubber compound, such as RTV 615, may be embodied as a solid dielectric comprising a dielectric strength of approximately 500 V/mil and a dielectric constant of approximately 2.7. Generally, the second material, or fill dielectric material, can have a high dielectric strength, and can be inert so as not to react chemically with the first material. While a two-component rubber material may be preferred, other high voltage silicone rubbers may be used. Moreover, as the dielectric constant of certain silicone rubbers may approach that of parylene, reductions in electric field strength multiplication in the material may be realized over materials with more disparate dielectric constants.

Figure 2:
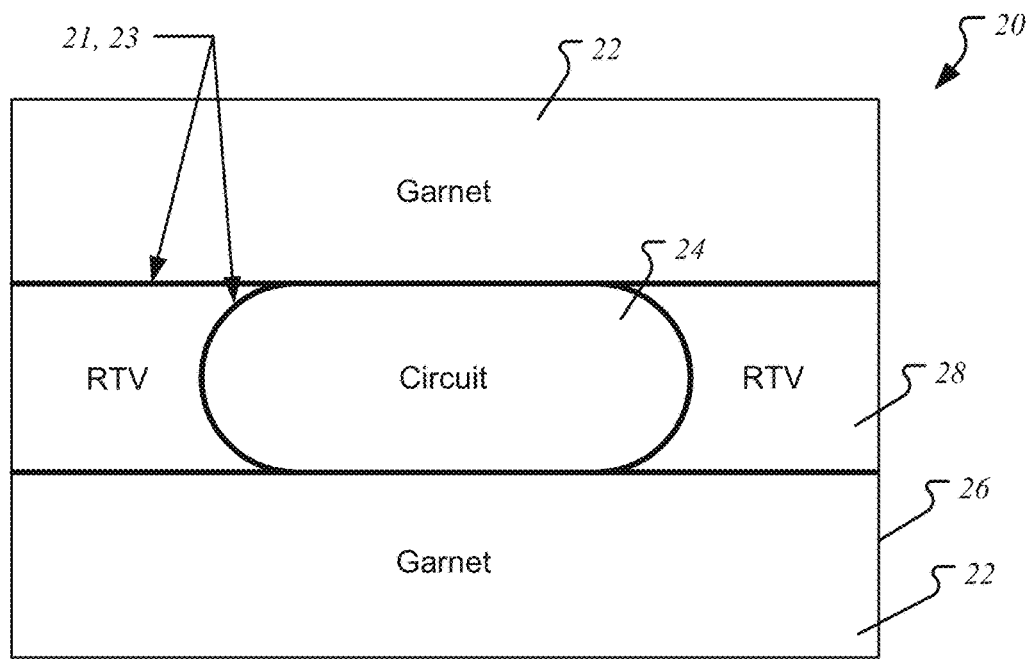
FIG. 2 is a cross-section view of a simplified RF circulator utilizing a multi-material potting scheme, according to one or more embodiments of the present disclosure.
Figure 6:
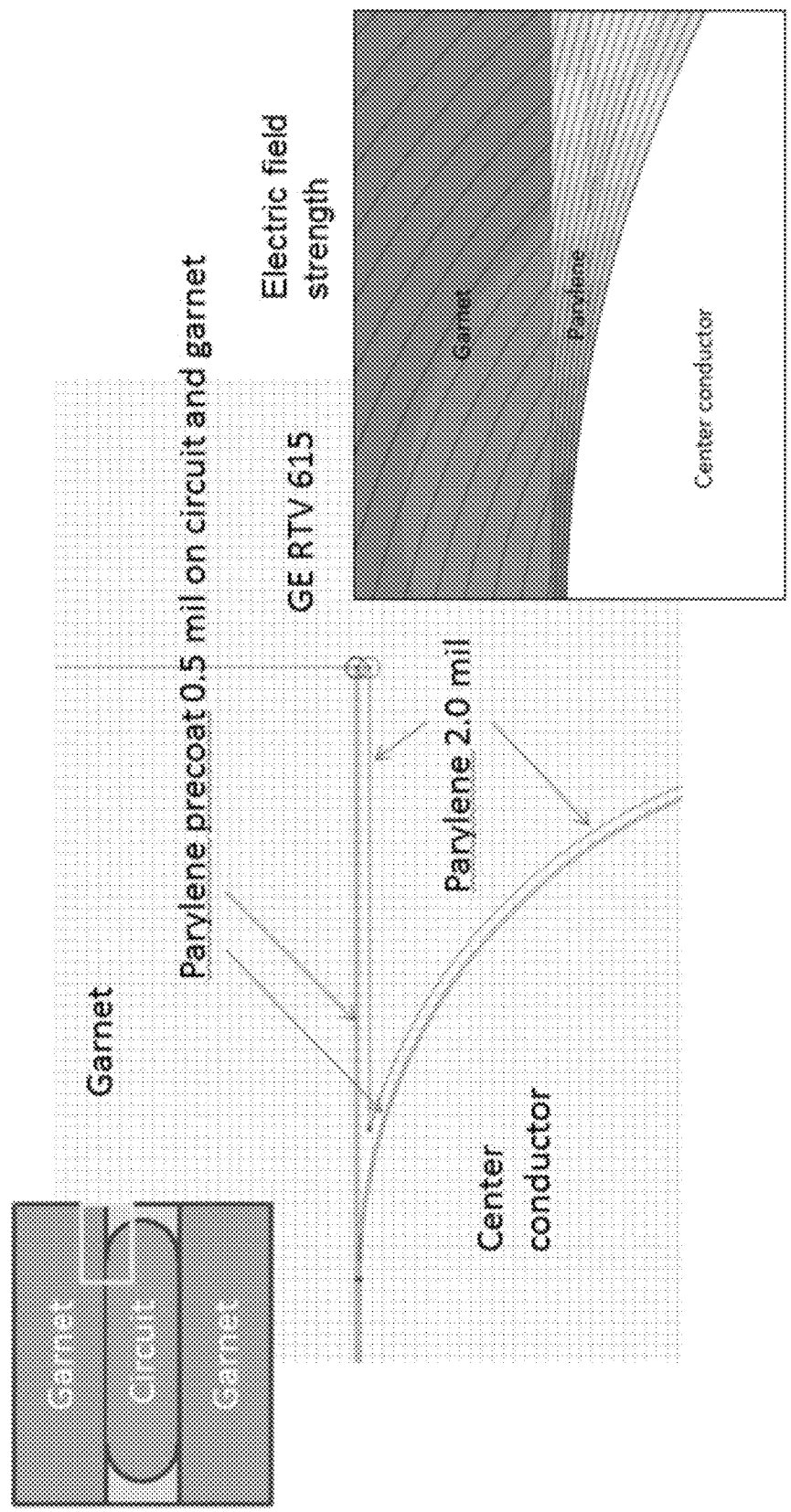
FIG. 6 shows exploded view illustrations of a portion of FIG. 2 showing a coating configuration according to one or more embodiments of the present disclosure.

Referring generally to FIG. 2, a simplified RF circulator 20 potted according to one or more embodiments of the presented disclosure is shown. Referring generally to FIG. 6, exploded view illustrations of a portion of FIG. 2 showing a coating configuration according to one or more embodiments of the present disclosure is shown. During a production process of circulator 20, a parylene coating may be applied on one or more exposed or exterior surfaces of the circulator assembly or circulator components. These components may include, for example, a control circuit 24 and associated ferrimagnetic garnets or ferrites 22. These components may be coated individually prior to the assembly of the circuit, and/or after they have been arranged within an associated circuit housing or enclosure 26. In one exemplary embodiment, an initial or first parylene coating 21 can be applied on the order of 0.1 to 3 mils or more by a chemical vapor deposition process, for instance. In one particularly advantageous embodiment, such as shown in FIG. 6, an initial or first parylene coating can have a thickness of 0.5 mil. Once coated, circuit components may be arranged within enclosure 26, after which a second parylene coating 23 can be applied to exposed surfaces of the circuit components and/or enclosure 26 via, for example, a back filling operation. In one embodiment, such as shown in FIG. 6, the second parylene coating or back fill 23 can be applied on the order of 2.0 mils. A liquid silicone rubber material 28 (e.g., RTV) may then be added within enclosure 26 and cured into a solid form. Generally, an embodiment such as shown in FIG. 6 can involve the following characteristics: a 27 mil push of parylene displacing RTV 615 at a highest electric field strength area, 8.97 MV/m max in parylene where the center conductor transitions from curved to flat, and 5.22 MV/m max in RTV 615 at the inner-most point or corner of the RTV 615.

In at least one embodiment, the two-component liquid silicone rubber material 28 can be first mixed together then added within enclosure 26 and cured into a solid form within said enclosure 26. In at least one embodiment, silicone rubber material 28 can be added until the remaining void space within enclosure 26 is filled, thus removing or displacing any air contained therein. A thickness of garnets 22 may be used to lower the electric field strength directly. An electric field (E) strength may be related to a thickness (m) of the garnets 22 and an applied voltage (V) via $$E = \frac{V}{m},$$

where increasing the thickness of the garnets 22 may decrease the electric field. The thickness of the garnets 22 may be increased to a predetermined thickness, wherein the predetermined thickness is determined by a limit before undesired and destructive moding in the garnets 22 (and ferrites) is reached. For example, the thickness of the garnets 22 may be greater than 0.15" at ultra-high frequencies (UHF), for instance, 0.22" at UHF.

The thickness of circuit 24 may be a predetermined thickness in order to adjust the electric field strength via a sharp edge of the circuit 24 at a juncture of the circuit 24, garnet 22, and potting material. For example, the sharp edge of the circuit 24 of a thin plated metal may act as an electric field strength multiplier. In a non-limiting embodiment, a copper plate may have a mass of 1 ounce and a thickness of 0.0006" in order to create the sharp edge having a sharp discontinuity as compared to a rounded edge feature in the circuit 24 which may reduce the electric field strength multiplier. The rounded edge may distribute the electric field strength discontinuity over a larger area. Thus, circuit 24 may be fabricated thicker, wherein post-processing may round and deburr the edge of the circuit 24. For example, the circuit 24 may be fabricated with a thickness between 0.01" and 0.3", such as 0.02".

Figure 3:
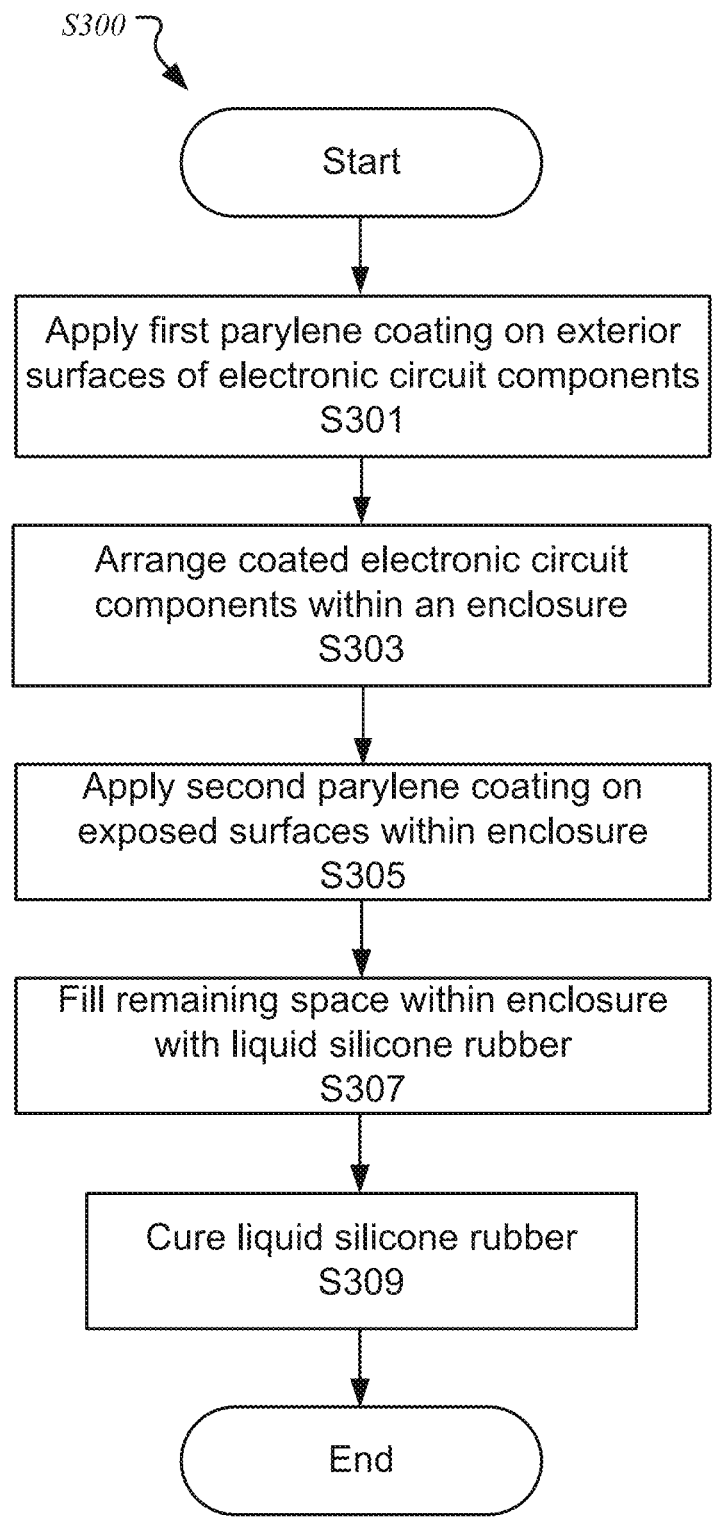
FIG. 3 is a simplified process diagram illustrating a method of potting a circuit, according to one or more embodiments of the present disclosure.

Referring generally to FIG. 3, an exemplary method S300 of potting an electrical circuit according to one or more embodiments of the disclosure. The method S300 may include the steps of applying S301 the first or initial coating 21 of the polymer material (e.g., the first parylene coating) having a first dielectric strength, to a surface of the circuit 24. Once coated, the circuit 24 can be arranged S303 within the sealable enclosure 26, after which the second coating 23 of polymer material (e.g., a second parylene coating) can be applied S305 to exposed surfaces within the enclosure 26. After the second coating 23 is applied, the remaining void space defined within the enclosure 26 can be filled S307 with the silicone rubber material 28, such as a silicone rubber solid dielectric having a second dielectric strength that is lower than the dielectric strength of the first material. Finally, the enclosure 26 can be sealed S309.

FIG. 4 illustrates simulated electric field strengths in the same region A between an edge of circuit 24 and garnet 22 of circulator assembly 20 of FIG. 2, which has been potted using methods according to embodiments of the present disclosure. As shown, electric field strengths in the region of one or more parylene coatings 21, 23 can be reduced to approximately 9.0 MV/m, and further reduced to approximately 5.2 MV/m in the silicone rubber material 28 (e.g., RTV 615) fill. These results are further quantified in the table of FIG. 5. As shown, a resulting 100% increase in the factor of safety of an exemplary circulator may be realized using potting schemes according to embodiments of the present disclosure compared to that achieved by existing silicone rubber potting processes.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components.

The foregoing discussion describes merely exemplary embodiments of the present disclosure. As will be understood by those skilled in the art, the present disclosure may be embodied in other specific forms without departing from the spirit or essential characteristics thereof. Accordingly, the disclosure is intended to be illustrative, but not limiting of the scope of the disclosure, as well as the claims. The disclosure, including any readily discernible variants of the teachings herein, defines in part, the scope of the foregoing claim terminology such that no inventive subject matter is dedicated to the public.

The invention claimed is:

1. A method for preventing corona effect in an electronic circuit, the electronic circuit including a control circuit and a garnet, the method comprising the steps of:
    applying a first polymer material having a first dielectric strength on a surface of the control circuit and on a surface of the garnet; and
    applying a second polymer material having a second dielectric strength that is lower than the first dielectric strength of the first material on an exposed surface of the first material,
    wherein the second material comprises a solid dielectric.

2. The method of claim 1, wherein the first polymer material comprises a parylene coating applied on the the surfaces of the control circuit and the garnet.

3. The method of claim 2, wherein the parylene coating has a dielectric strength of approximately 7,000 volts per mil (V/mil).

4. The method of claim 1, wherein the second polymer material comprises a silicone rubber compound.

5. The method of claim 1, wherein the solid dielectric has a dielectric strength of approximately 500 volts per mil (V/mil).

6. The method of claim 1, wherein the electronic circuit comprises a circulator.

7. The method of claim 1, further comprising arranging the electronic circuit within a housing.

8. The method of claim 7, wherein said applying the first polymer material on the surfaces of the control circuit and the garnet includes:
    applying a first coating of the first polymer material on the surfaces of the control circuit and the garnet, and
    applying a second coating of the first polymer material on at least one of the first coating of the first polymer material and a surface of the electronic circuit after the electronic circuit is arranged within the housing.

9. The method of claim 8, wherein the electronic circuit comprises a circulator, and wherein the second coating of the first polymer material is applied on the garnet of the circulator after the circulator is arranged within the housing.

10. The method of claim 7, wherein the second polymer material is applied by filling a remaining volume of the housing with the second polymer material.

\* \* \* \* \*